United States Patent
Mulawski (10) Patent No.: US 8,704,594 B2
(45) Date of Patent: Apr. 22, 2014

(54) DUAL RAIL OUT-PHASED ENVELOPE TRACKING MODULATOR

(75) Inventor: Steven A. Mulawski, Tyngsborough, MA (US)

(73) Assignee: Auriga Measurement Systems, LLC, Chelmsford, MA (US)

( * ) Notice: Subject to any disclaimer, the term of this patent is extended or adjusted under 35 U.S.C. 154(b) by 54 days.

(21) Appl. No.: 13/492,840

(22) Filed: Jun. 9, 2012

(65) Prior Publication Data

US 2012/0313702 A1 Dec. 13, 2012

Related U.S. Application Data

(60) Provisional application No. 61/495,284, filed on Jun. 9, 2011.

(51) Int. Cl.
*H03G 3/30* (2006.01)

(52) U.S. Cl.
USPC .......................................... 330/136; 332/144

(58) Field of Classification Search
USPC ............................ 330/136, 137, 140; 332/144
See application file for complete search history.

(56) References Cited

U.S. PATENT DOCUMENTS

| | | | |
|---|---|---|---|
| 5,942,938 A * | 8/1999 | Myers et al. | 330/10 |
| 6,788,151 B2 * | 9/2004 | Shvarts et al. | 330/297 |
| 6,822,523 B2 * | 11/2004 | Grosspietsch et al. | 332/149 |
| 7,058,823 B2 | 6/2006 | Lapidus | |
| 7,482,869 B2 | 1/2009 | Wilson | |
| 7,932,780 B2 * | 4/2011 | Elia | 330/277 |
| 2003/0198300 A1 | 10/2003 | Matero et al. | |
| 2004/0071225 A1 | 4/2004 | Suzuki et al. | |
| 2005/0136854 A1 | 6/2005 | Akizuki et al. | |
| 2006/0209984 A1 | 9/2006 | Kenington | |

OTHER PUBLICATIONS

"Nujira HAT™ Power Modulator;" pages of catalog; Feb. 3, 2008; 2 pages.

* cited by examiner

*Primary Examiner* — Joseph Chang
(74) *Attorney, Agent, or Firm* — Daly, Crowley, Mofford & Durkee, LLP (57) ABSTRACT

A drain modulator circuit for operation with a radio frequency (RF) amplifier, includes a pair of AC signal sources each of the AC signal sources having an output at which an AC signal is provided. The drain modulator circuit further includes a pair of tapped delay elements, each of which is configured to receive an AC signal from a respective one of the AC signal sources and a control element coupled to provide one or more control signals to the pair of tapped delay elements such that the tapped delay elements provide a selected instantaneous differential voltage to the RF amplifier.

19 Claims, 9 Drawing Sheets

DUAL RAIL OUT-PHASED ENVELOPE TRACKING MODULATOR

CROSS REFERENCE TO RELATED APPLICATION

This application claims the benefit of U.S. Provisional Application No. 61/495,284 filed Jun. 9, 2011 under 35 U.S.C. §119(e) which application is hereby incorporated herein by reference in its entirety.

FIELD OF THE INVENTION

The structures and techniques described herein relate to radio frequency (RF) circuits and more particularly to RF amplifier circuits.

BACKGROUND OF THE INVENTION

As is known in the art, circuitry such as that described in U.S. Pat. Nos. 6,788,151 and 7,482,869 includes a radio frequency (RF) amplifier which can be operated at high efficiency because direct current (DC) power dissipation can be reduced by tracking a change in an envelope of an RF input signal received by an RF amplifier. However, a relatively complex circuit is needed to provide a reference signal representing a desired power supply voltage that corresponds to the envelope of the RF input signal. In some cases, the reference signal is generated by detecting the input RF signal, rectifying it to generate an envelope of the input signal, and subsequently providing the envelope signal to a supply voltage adjustment circuit while at the same time providing it to a power supply selection circuit to select a desired supply voltage. In this technique, the circuits all have to be synchronized which can be relatively difficult. Furthermore, this technique is performed with analog signals. Consequently, the circuits are sensitive to variations in the operating characteristics of devices resultant from temperature changes and also to differences in device operating characteristics (e.g. due to manufacturing tolerances) which reduces yield of the circuitry.

SUMMARY OF THE INVENTION

In accordance with the concepts, systems and techniques described herein, a drain modulator circuit for operation with a radio frequency (RF) amplifier, includes a pair of AC signal sources each of the AC signal sources having an output at which an AC signal is provided. The drain modulator circuit further includes a pair of tapped delay elements, each of which is configured to receive an AC signal from a respective one of the AC signal sources; and a control element coupled to provide one or more control signals to said pair of tapped delay elements such that said tapped delay elements provide a selected instantaneous differential voltage to said power amplifier.

With this particular arrangement, the AC signal sources are provided as voltage sources which drive the tapped delay elements. By selecting signals from the tapped delay elements, the drain modulator circuit provides a differential voltage to the RF amplifier. This technique results in a drain modulator circuit which can operate at RF amplifier bandwidths of 500 MHz and above. In one embodiment, the signals sources provide a pair of sine wave signals which are 180 degrees out of phase and which have a frequency which is low compared with an envelope BW of the RF amplifier. For example, in a system having a 500 MHz envelope bandwidth, the frequency of the sine wave signals provided by the signal sources need only be in the range of about 10 MHz to 100 MHz with 50 MHz being preferred. It should be appreciated that a trade-off must be made between the frequency of the signals provided by signal sources and the amount of phase which must be stored in the tapped delay element (i.e. the higher the frequency, the less phase which must be stored in the tapped delay element).

It should be appreciated that the signal sources can provide signals having shapes other than sinusoidal. Any signal shape can be used (e.g. triangular, or even an irregular signal shape) as long as the signal level varies as a function of time.

It should also be appreciated that the drain modulator circuit described herein is suitable for operation with any RF amplifier including power amplifiers and is also suitable for use with any RF amplifier envelope bandwidth (i.e. the drain modulator circuit and techniques described herein is not limited to use with high bandwidths.

In accordance with a further aspect of the concepts, systems and techniques described herein, a Dual Rail Out-Phased Envelope Tracking (DROP ET) system for use with a radio frequency (RF) amplifier includes a pair of sine wave power sources and tapped delay lines, or phase shifters, to continuously select the desired instantaneous DC voltage, by selecting or tapping from points on the two sine waves (i.e. it is a modulator architecture). When the sine waves are 180 degrees out of phase (out-phased), the maximum voltage available is 2× the sine peak amplitude. For example, If two sine wave signals having a 25 volt (V) peak amplitudes are 180 out of phase, the resultant differential voltage is 50 V (i.e. 50 V is provided across the amplifier or other load. Other phasing, may of course, also be used.

In one embodiment, a processor-based controller (e.g. an FPGA-based controller) takes input from the radio baseband, about the expected amplitude of the carrier, and moves the taps to provide the differential voltage, which is applied to an RF power amplifier (PA). The PA is not DC grounded, (it floats), thereby making it possible to use two sine wave sources to provide a differential. In one embodiment, 180 degrees of phase is stored in delay lines. This means that the polarity of the sine waves must be "flipped" every 180 degrees (otherwise, the voltage polarity on the PA will be reversed which could destroy the PA).

One advantage provided by this arrangement is that one can track very high speed envelope changes. For example, one can track high bandwidth envelope (500 MHz) using sine waves that cycle at a frequency in the range of about 50 MHz.

In theory, the circuits and techniques described herein will work over any frequency range. The frequency of the AC source itself, poses no limit on the tracking bandwidth. The practical limitations are the amount of delay that must be provided (and in embodiments in which the variable delay element is provided as a tapped delay element, the number of taps needed). In one embodiment, as the frequency of the AC waveform decreases, the period increases, and no matter what frequency is used, one must always store 180 degrees of phase of the waveform period, (when only two phases are used). Additionally, long delays get lossy, which erodes the efficiency potential of the architecture.

As the period increases, the voltage changes more slowly over time, requiring larger storage elements (inductors and capacitors). Implementing the phase delay in a distributed or lumped transmission line will consume more space, as the frequency decreases.

From a speed perspective, it is still necessary to deliver the differential voltage quickly, through the tap switches, to the RF PA. Distances from the delay line become critical. As the envelope bandwidth increases, the voltage delivery time becomes very short. All taps may need to be within an inch or so, of the RF PA inputs. This technique results in a system which is much more power efficient than operating a conventional pulse width modulator (PWM) at an extremely high frequency (e.g. 20 GHz), to achieve envelope compliance.

Described herein is an innovative approach (Dual Rail Out-Phase Envelope Tracking: DROP ET) to an envelope tracking (ET) amplifier which can meet the challenging goal of 500 MHz modulation bandwidth for a signal with 6 dB peak-to-average ratio.

In the circuit and technique described herein, a drain modulation is accomplished by phase modulating two AC signal sources (e.g. low frequency (50 MHz) sine wave signal sources). A differential voltage between the two sources is controlled by the phase relationship between the two sources. A phase adjustment technique creates a differential voltage waveform that reflects the envelope of the RF signal (500 MHz). This differential voltage between the two sources is applied to the envelope tracking amplifier. The amplifier amplifies a modulated RF signal while the differential voltage maintains the voltage across the amplifier to a necessary-minimum to keep the efficiency at maximum while maintaining RF signal quality. Drain side modulator of the amplifier will source the bias current and source side modulator will sink it to close the current loop of the amplifier.

Since the generation of drain bias is carried out at a frequency which is lower than an envelope generation frequency (e.g. a 50 MHz drain bias frequency vs. envelope generation at 500 MHz), a much higher efficiency will be achieved compared to envelope generation at 500 MHz in conventional envelope tracking (ET). Simulation results predict that the DROP ET modulator consumes as little as 20% of a modulator in conventional traditional ET at high envelope bandwidths. The overall efficiency impact of drain modulator to the complete power amplifier module is less than 10% compared to almost 50-100% for the traditional envelope tracking.

In a DROP ET system of the type described herein, the modulation frequency is not limited by the switching speed of transistors and amplifiers (e.g. CMOS transistors and amplifiers) but by the phase shifter speed, which can support a much higher frequency than a CMOS amplifier. Since efficiency loss in the modulator is minimum in DROP ET compared to the conventional envelope tracking, this approach leads to the revolutionary advances in the composite efficiency of the RF amplification of high frequency modulation.

In accordance with one aspect of the concepts, circuits and techniques described herein, a modulator circuit for operation with a radio frequency (RF) amplifier circuit (or other load) includes a pair of signal sources, each of which provides an AC signal to one of a pair of variable delay elements. A control element provides one or more control signals to the pair of variable delay elements such that the variable delay elements a delay or phase shift between the AC signals which results in a selected instantaneous differential voltage across bias terminals of the RF amplifier (or other load). Thus, the instantaneous bias voltage presented to the RF amplifier (or other load) is a function of the amplitudes of the two AC signals, and the phase angle between them (or stated differently, the differential voltages are generated by out-phasing the respective ones of the pair of the AC signals).

In one embodiment, a first one of the pair of signal sources provides a first modulation signal to a drain terminal of an RF amplifier and a second one of the pair of signal sources provides a second modulation signal to a source terminal of the RF amplifier. The control element establishes a phase relationship between the first and second modulation signals to thus establish a particular differential signal across the drain and source terminals of the RF amplifier. Thus, the modulator circuit utilizes a full bridge technique to modulate power to the RF amplifier and phase shifting is utilized to provide a desired differential voltage to bias the RF amplifier for efficient operation.

The signal sources may be provided as analog or digital sources which provide (or are capable of generating) an AC (or AC equivalent) signal. The signal sources can are provided as pulse width modulator (PWM) sources or any other type of AC signal source. In some embodiments, the signal sources provide signals having the signal characteristics (e.g. same peak amplitude and waveform) and the phase of the two signals can be adjusted as needed to generate a desired differential voltage across bias terminals of the amplifier. In other embodiments, some or all of the signal characteristic of the signals provided by the two signal sources are not the same (the signal sources provide signals having different peak amplitudes and/or different waveforms and/or differences in other signal characteristics) and the phase of the two signals can be adjusted as needed to generate a desired differential voltage across bias terminals of the amplifier. In some embodiments one or both of the AC signal sources can vary frequency and/or amplitude and/or phase of the signal provided thereby to this provide a variable frequency and/or variable amplitude AC signal. In one embodiment, each of said pair of AC signal sources generates a fixed-frequency sine wave. In one particular embodiment, each of the pair of AC signal sources generates a sine wave having a fixed-frequency of 50 MHz.

In one embodiment, each of the pair of AC voltage sources indirectly source a voltage to the RF amplifier (or other load) based upon a selected phase difference (e.g. a DC source is being modulated to generate a desired AC signal).

In one embodiment, the pair of AC signal sources are provided as AC voltage sources which provide signals having a frequency which is lower that an envelope bandwidth.

It should be understood that in some embodiments, the AC signal sources provide AC signals having like waveforms and which are 180 degrees out of phase. By providing like waveform AC signals (e.g. sine wave signals) which are 180 degrees out of phase, a maximum differential voltage can be applied to a load such as an RF amplifier.

It should be understood that the signals provided by the signal sources may or may not have the same peak amplitude levels (or the same peak-to-peak amplitude levels). It may be desirable to provide the two signal sources having different or asymmetric amplitudes (or other signal characteristics) to the needs of a particular application. One of ordinary skill in the art will appreciate how to determine when it may be useful or even necessary to use signals with are not symmetric. For example, it may be desirable or even necessary to provide signals having different peak amplitudes if it is necessary to get a load to swing above or below a nominal 0 voltage level. For example, it may be necessary to restrict a load swing to avoid damaging a circuit component to a certain voltage level. (e.g., because an amplifier be damaged by a certain offset voltage).

For example, an amplifier may be able to survive a +50 V swing but may be damaged (or even destroyed) by a −25 V swing. Thus, in this case it would be desirable for the first source (e.g. source 12a in FIG. 1) to provide a sine wave signal having a peak amplitude of 25 volts (V) and for a second source (e.g. source 12b in FIG. 1) to provide a sine wave signal having a peak amplitude of 50 V.

In one embodiment, the pair of AC signal sources includes a pair of phase locked, pulse width modulated (PWM), switch-mode amplifiers (e.g. class-D, E, F amplifiers) which provide a pair of out-phased, sine wave voltage rails and wherein the load (e.g. RF amplifier) is configured to float between the two voltage rails and wherein the bias voltage value is determined, at least in part, by load demand (e.g. RF envelope demand in the case of an ET amplifier).

In one embodiment, the variable delay elements may be provided as analog or digital delay elements such as tapped delay elements or phase shifter elements. In one embodiment, the variable delay elements are provided as a pair of tapped delay elements.

In one embodiment, the pair of variable delay elements are provided as a pair of phase memory elements, each of the phase memory elements having a first input coupled to an output of a respective one of the AC voltage sources and a first output configured to couple to a respective one of a pair of inputs of the power amplifier and wherein said phase shifters operated to select an instantaneous differential voltage.

In one embodiment, the variable delay elements include phase shifters configured to apply a phase shift between AC signals (e.g. two sine wave signals) to thereby enable rapid voltage changes across the RF amplifier to provide the RF amplifier having desired slew rates.

In one embodiment, the control element is provided as a field programmable gate array (FPGA) and the modulator circuit is configured to operate with an ET RF amplifier having a predetermined RF envelope demand. The envelope signal is fed into the FPGA which allows a needed differential voltage to be quickly identified such that the variable delay elements can be set to establish the desired differential voltage. In one particular embodiment, the control element is provided by an FPGA the variable delay elements are provided as tapped delay lines and when a baseband input to the FPGA has been processed, the FPGA adjusts the tapped delay line to set a phase difference (θ) between the AC signals provided by the pair of signal sources. The phase difference sets an instantaneous bias voltage and the controller adjusts an RF amplifier bias voltage by continuously switching taps on the delay line, tracking the required voltage differential along the delay line for up to 380 degrees of phase of the AC signal. In one embodiment, in response to a predetermined phase difference, the controller reverses the out-phased AC signal sources between drain and source ports to maintain correct voltage polarity with respect to the RF amplifier drain and source ports. It should be appreciated that an FPGA or any other type of processor could be used as long as the processor has a speed sufficient to generate the AC source frequency at which the circuit operates.

In one embodiment, a static phase difference between the drain and source rails is 180° to provide maximum operating bias.

In one embodiment, an instantaneous voltage differential, $A_3$ is determined using the equation, $A_3=|A_1 \sin\theta - A_2 \sin\theta - 180°|$, where θ is the phase difference between the drain and source voltages.

In one embodiment, the two AC signals are provided as two sine waves with constantly cycling amplitudes and the variable delay elements are provided as a pair of tapped delay lines and phase and a history of 180 degrees of phase is stored in each tapped delay line.

In one embodiment, the modulator circuit is coupled to an RF amplifier circuit and the RF amplifier circuit is provided as an RF power amplifier circuit.

BRIEF DESCRIPTION OF THE DRAWINGS

The foregoing features of this invention, as well as the invention itself, may be more fully understood from the following description of the drawings in which.

DETAILED DESCRIPTION OF THE PREFERRED EMBODIMENTS

Figure 1:
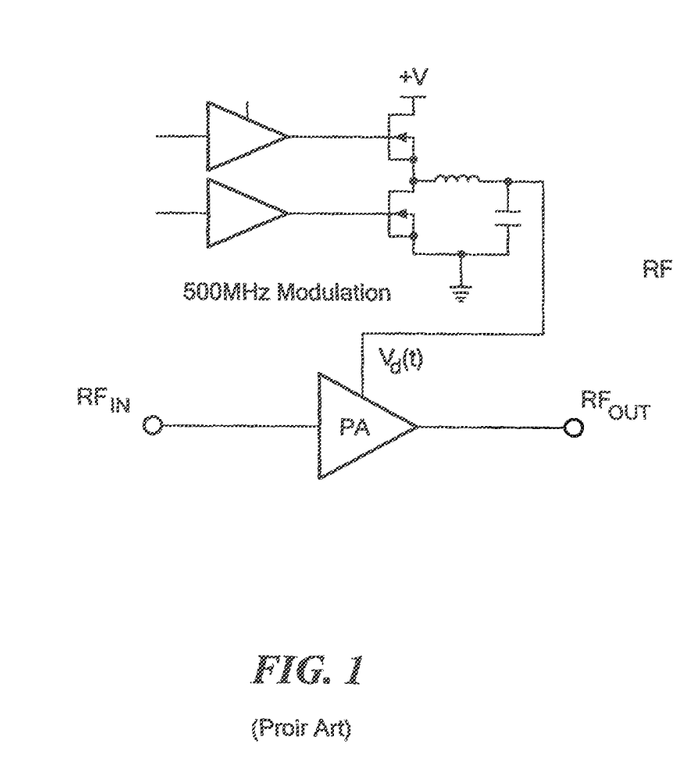
FIG. 1 is a block diagram of a prior art envelope tracking (ET) system.

Referring now to FIG. 1, a conventional envelope tracking system is shown. In this system, a drain supply voltage is modulated by the envelope waveform created by a high speed pulse width modulator (PWM) circuit. This approach is limited by the clock rate of a pulse stream generated by the PWM circuit. The clock rate is typically ten or twenty times the envelope bandwidth of the amplifier. Thus, as the envelope bandwidth increases, the clock rate must also increase for proper operation of the circuit.

For example, generation of an envelope signal with a 500 MHz bandwidth necessitates a clock frequency of 20 GHz or more. Generation of such high speed signals requires significant DC power to drive large MOSFET gates of the PWM circuit. Furthermore, additional losses incurred by switching large voltages and currents to support the required RF power levels, reduces the overall efficiency to an impractical level.

Figure 2:
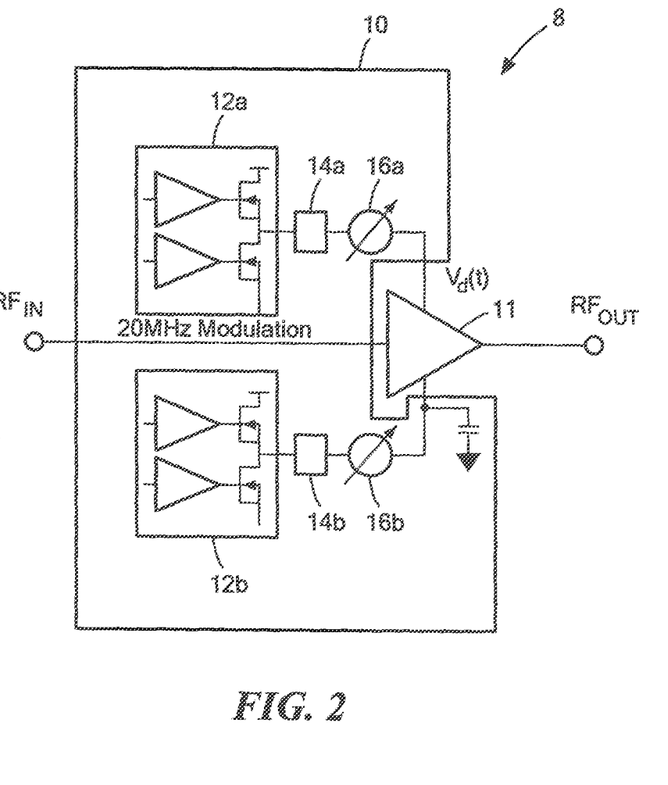
FIG. 2 is a block diagram of a Dual Rail Out Phased Envelope Tracking (DROP ET) system.

Referring now to FIG. 2, and in accordance with the circuits and techniques described herein, a DROP envelope tracking (ET) amplifier 8 includes a modulator circuit 10 for operation with a radio frequency (RF) amplifier 11 having a pair of bias terminals. The modulator includes a pair of AC signal sources 12a, 12b, each having an output at which an AC signal is provided and a pair of variable delay elements 16a, 16b coupled to receive AC signals from respective ones of the AC signal sources and to provide appropriated delayed or phase shifted signals to bias terminals of an RF amplifier 11. In response to the one or more control signals from a control element (FIG. 3) the variable delay elements introduce a relative shift between the AC signals provided by the pair of AC signal sources such that a differential voltage is provided across the bias terminals of RF amplifier 11.

When the bias terminals of RF amplifier 1 correspond to drain and source terminals of the amplifier, modulator circuit 10 is referred to as a drain modulation circuit 10. In one exemplary embodiment, drain modulation circuit 10 includes a pair of signal sources 12a, 12b which preferably provide a signal having a relatively low frequency. Thus, the signal sources 12a, 12b are said to be low frequency. In practical RF cases, low frequency refers to operation below the operating frequency range of the amplifier. Signal sources 12a, 12b provide modulation signals to amplifier 11 through respective ones of level adjust circuits 14a, 14b and phase shifter circuits 16a, 16b which, in one embodiment, are provided as high speed phase shifters. Tracking modulation is the purpose of the high-speed phase shifter (delay or storage element). In one embodiment, drain modulation circuit 10 provides modulation signals to inputs of an envelope tracking (ET) amplifier 18 which may, for example, be provided as an ET power amplifier (PA) 18. By varying the relative phases of the pair of modulation signals, it is possible to provide a desired voltage across the amplifier. Thus, if it were necessary to provide an instantaneous differential voltage across the amplifier of 50 V, for example, and each source provides a sine wave AC signal having a peak amplitude of 25 V, then by setting the phases of the two signal 180 degrees out of phase, a differential voltage of 50 V Is provided across the amplifier. Thus, in this example, a phase difference of 180 degrees between the signals provided by the signal sources results in a maximum voltage across the amplifier.

Drain modulation is accomplished by appropriately phase modulating the two low frequency signal sources 12a, 12b. An example would be the function of FIG. 2, where the continuously varying AC waveforms are generated by PWM functions in an FPGA and the phase of these waveforms is being adjusted by the RF baseband processor. Since the baseband processor supplies the modulation to the amplifier, it has a-priori knowledge of the amplifier's voltage demand. This voltage demand is met by adjusting the phase of the two waveforms, to provide just enough voltage differential across the amplifier (load), to support the required amplifier output power, without wasting power. In one exemplary embodiment, the signal sources are provided as 50 MHz sine wave sources.

Differential voltage between the two sources 12a, 12b is controlled by the phase relationship between sources 12a, 12b. A phase adjustment process generates a differential voltage waveform that reflects the envelope of the RF signal (e.g. a 500 MHz RF signal). This differential voltage between the two sources 12a, 12b is applied to envelope tracking amplifier 18. Amplifier 18 amplifies a modulated RF signal while the differential voltage maintains the voltage across amplifier 18 to a necessary-minimum to keep the efficiency at maximum. The drain side modulator Drain is a term associated with RF amplifiers, because the bias supply connects to the FET, drain terminal. Typically it is a high-side or current-sourcing power supply. The low-side power is usually called the "current-sinking" bias supply of the amplifier will source the bias current and the source side modulator will sink it to close the current loop of the PA.

Since the generation of a drain bias signal is carried out at a frequency which is lower than an envelope bandwidth (e.g. a 50 MHz drain frequency vs. envelope generation at 500 MHz), a much higher efficiency will be achieved compared to envelope generation in a conventional ET amplifier.

Predicted results indicate that the DROP ET modulator described herein consumes as little as 20% of the power consumed by a modulator in a conventional ET circuit. In one embodiment, the overall efficiency impact of drain modulator to the complete power amplifier module FIG. 9 and FIG. 10 together is less than 10% compared to almost 50-100% for a conventional envelope tracking system.

In the DROP ET architecture of FIG. 2, the modulation frequency is not limited by the speed of transistors (e.g. modulation frequency is not limited by the switching speed of CMOS transistors) but by the phase shifter speed which can support a much higher frequency than a CMOS amplifier. The PWM generated waveforms change relatively slowly over time, compared to the changing voltage requirements of an envelope-tracked amplifier. If a waveform is stored in a delay line or memory element, that stored energy can be utilized. Since the stored waveform can contain all voltages from zero to maximum, any voltage can be selected by taps in the memory element(s). Enabling these taps can be done an order of magnitude faster than changing the output amplitude of a PWM power supply. Utilizing high-speed GaN FETS, for example, can allow voltage selection from the memory elements, at speeds of several GHz. Given the same technologies, it is difficult to conceive of a PWM circuit, providing a high-power waveform cycling at 250 MHz. It is really efficiency gain, using the DROP ET technique. A conventional PWM circuit, even using the best technology consumes significantly more power. But the big advantage is the tracking speed of tracking bandwidth. Since the energy is already stored in the memory elements, one needs only to select the desired voltage. Generating the switch function can happen at many GHz. Ramping a voltage at several GHz, consumes huge amounts of power in the modulator is minimum in DROP ET compared to efficiency loss in the conventional envelope tracking circuits, this approach leads to advances in the composite efficiency of the RF amplification of high bandwidth modulation. An example of efficiency is as follows:

A conventional PWM-based ET circuit operating at 500 MHz, powering a 20 W RF PA, would consume approximately 40 watts, based on FET and FET driver power consumption only. Using the DROP ET method, where only 50 MHz PWMs are used and the phase memory elements are tapped using FET switches would consume about 4 W of power.

The DROP ET technology described herein is suited to meet power amplifier RF envelope bandwidths greater than 500 MHz with a modulated signal having a peak-to-average amplitude ratio of 3 dB or more.

As shown in the exemplary embodiment of FIG. 2, a DROP ET amplifier 10 includes a pair of low frequency AC voltage sources and generates differential voltage by out-phasing these two low frequency signals (FIG. 1). High speed and high efficiency modulation is possible with this technique because the sources 12a, 12b are operated at low frequency.

Fixed-frequency sine waves can be efficiently generated at 50 MHz and provide fast slew rates, enabling rapid voltage changes across the RF PA, by applying a very fast phase shift between the two alternating waveforms.

Figure 3:
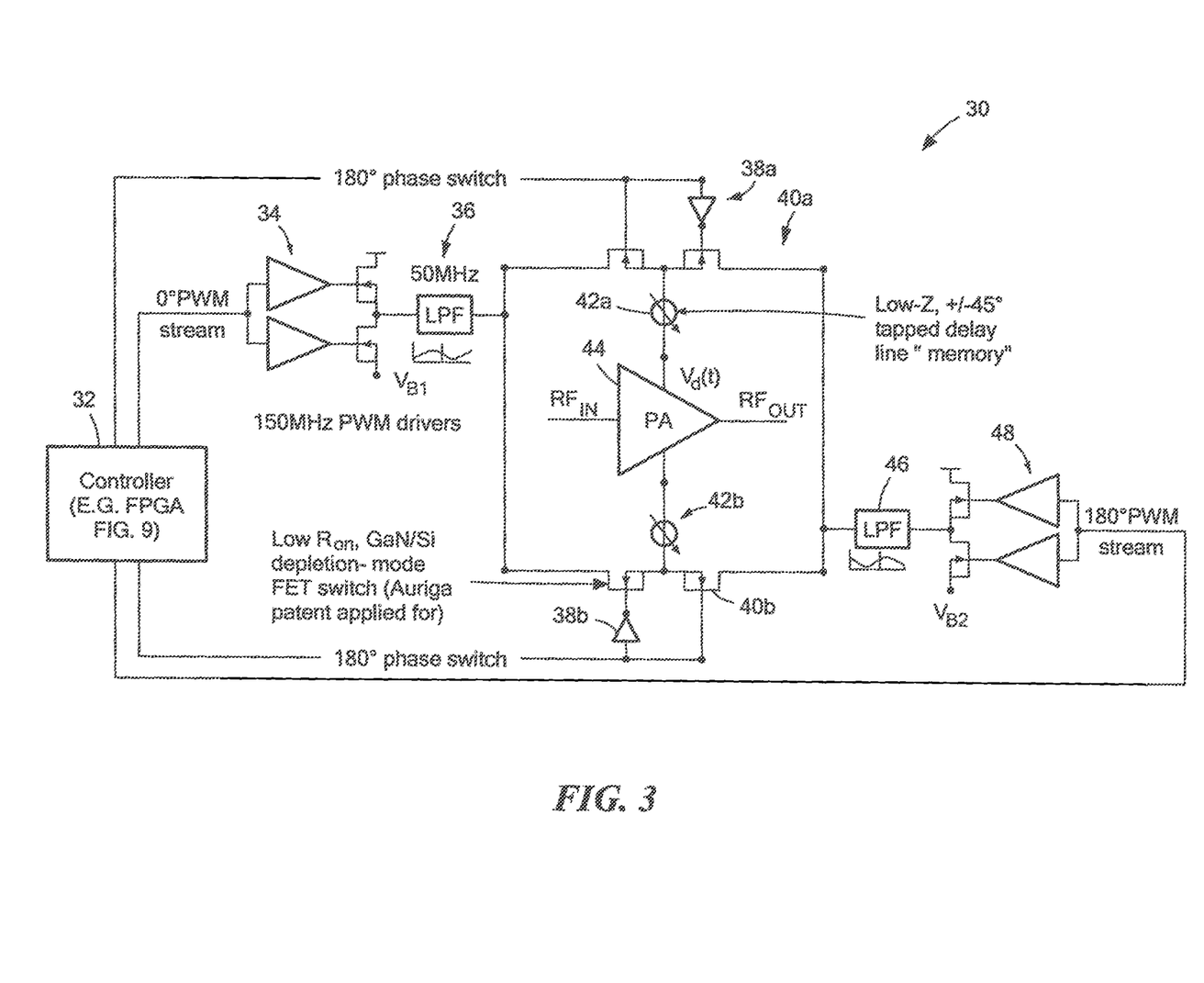
FIG. 3 is a block diagram of a Dual Rail Out Phased Envelope Tracking (DROP ET) system.

Referring now to FIG. 3, a DROP ET modulator 30 utilizes two out-phased, sine wave voltage rails (e.g. 50 MHz sine wave voltage rails), generated by two phase locked, pulse width modulated, class-switch-mode amplifiers, to supply instantaneous bias demand of a 10 GHz, RF PA 44. Each sine wave signal has a peak-to-peak amplitude which is one-half of the PA bias voltage, required to produce the specified peak RF power. The PA is floating between the two voltage rails. The bias voltage value is determined by RF envelope demand (information from baseband), and by proprietary slew-rate limiting algorithms, running in the FPGA-based controller.

Figure 4:
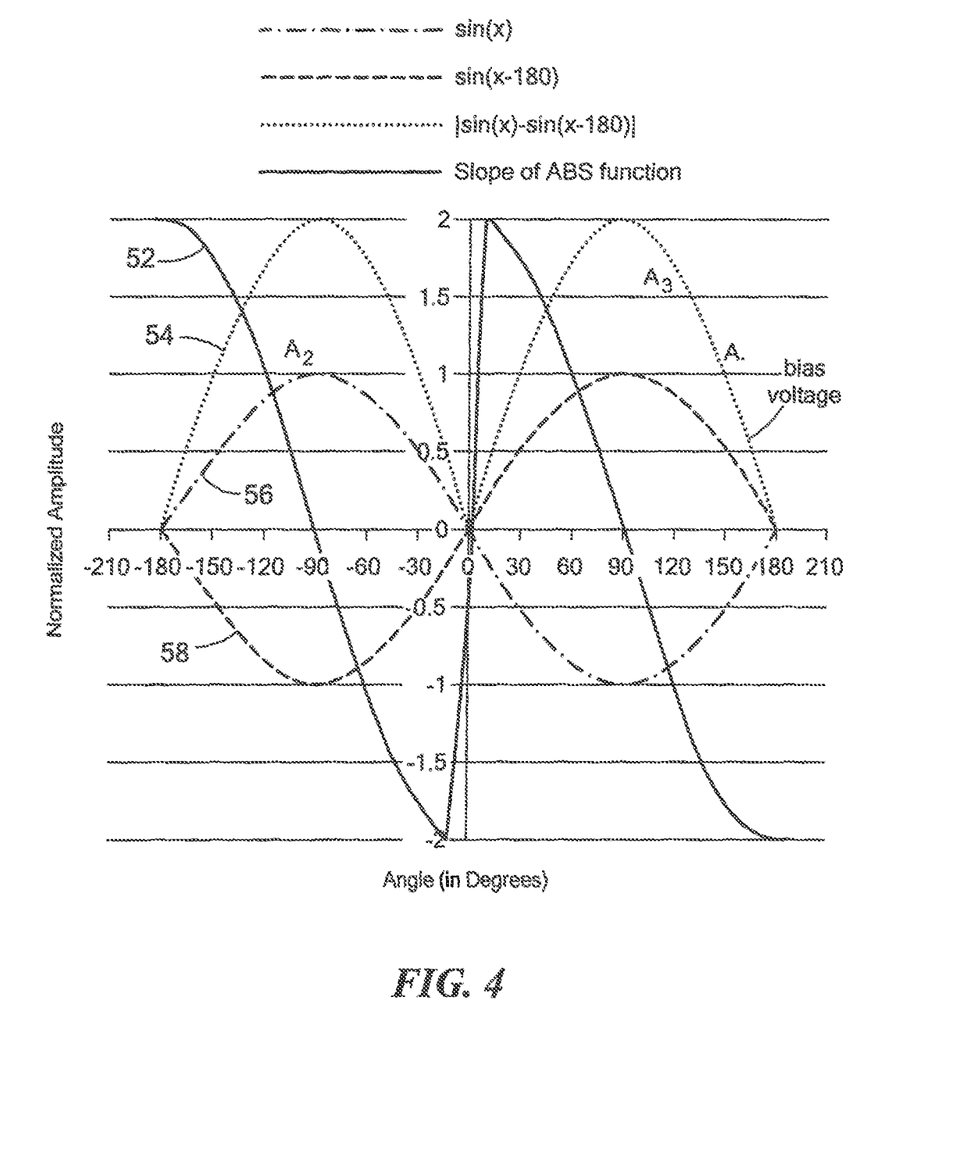
FIG. 4 is a plot of normalized angle vs. amplitude for 0-degree phase difference.
Figure 5:
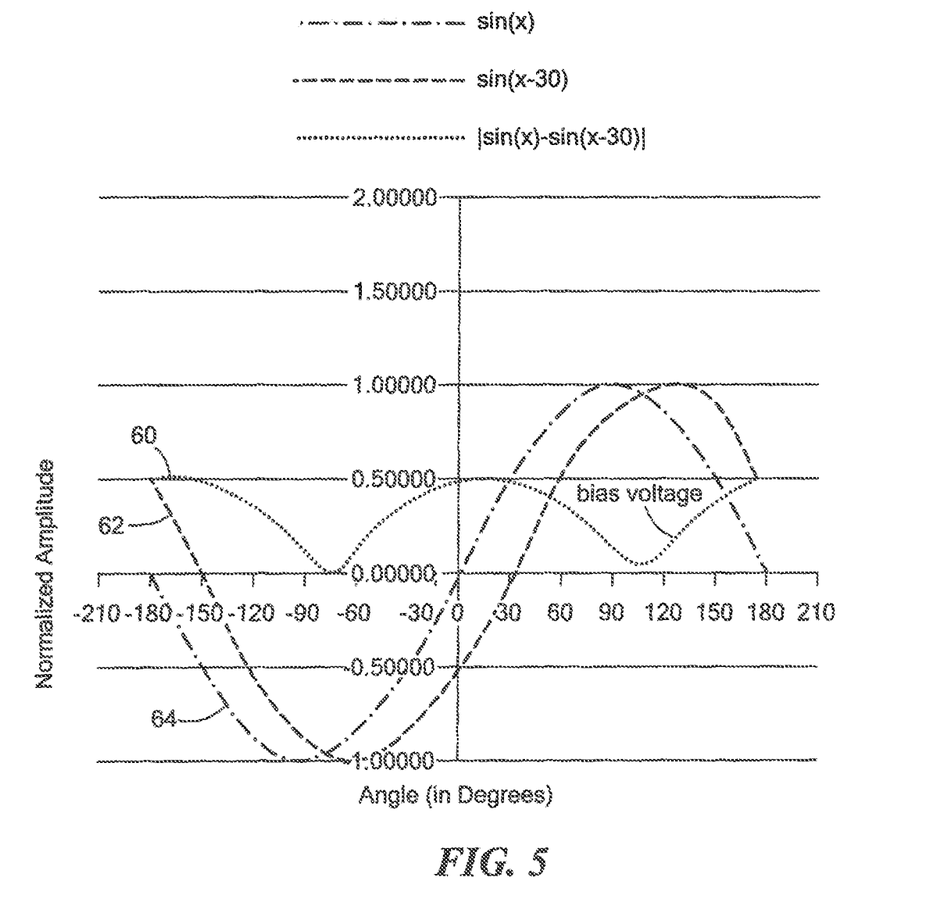
FIG. 5 is a plot of normalized angle vs. amplitude for 30-degree phase difference.
Figure 6:
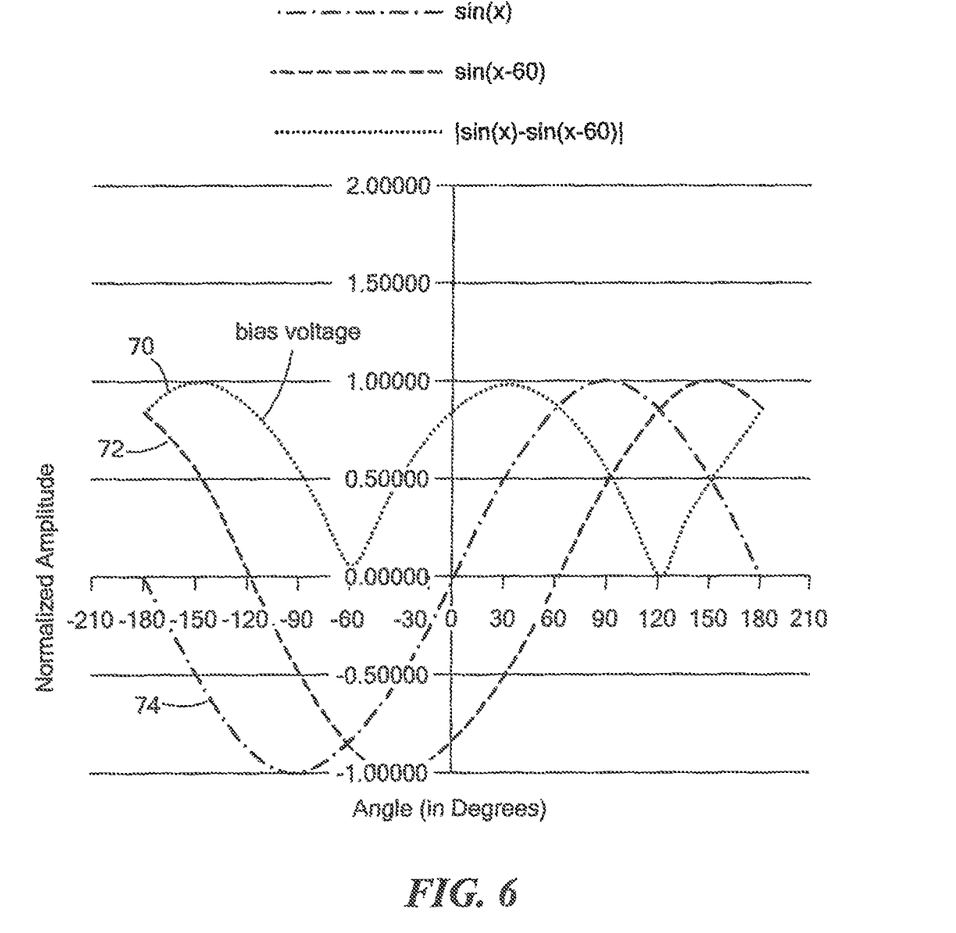
FIG. 6 is a plot of normalized angle vs. amplitude for 60-degree phase difference.
Figure 7:
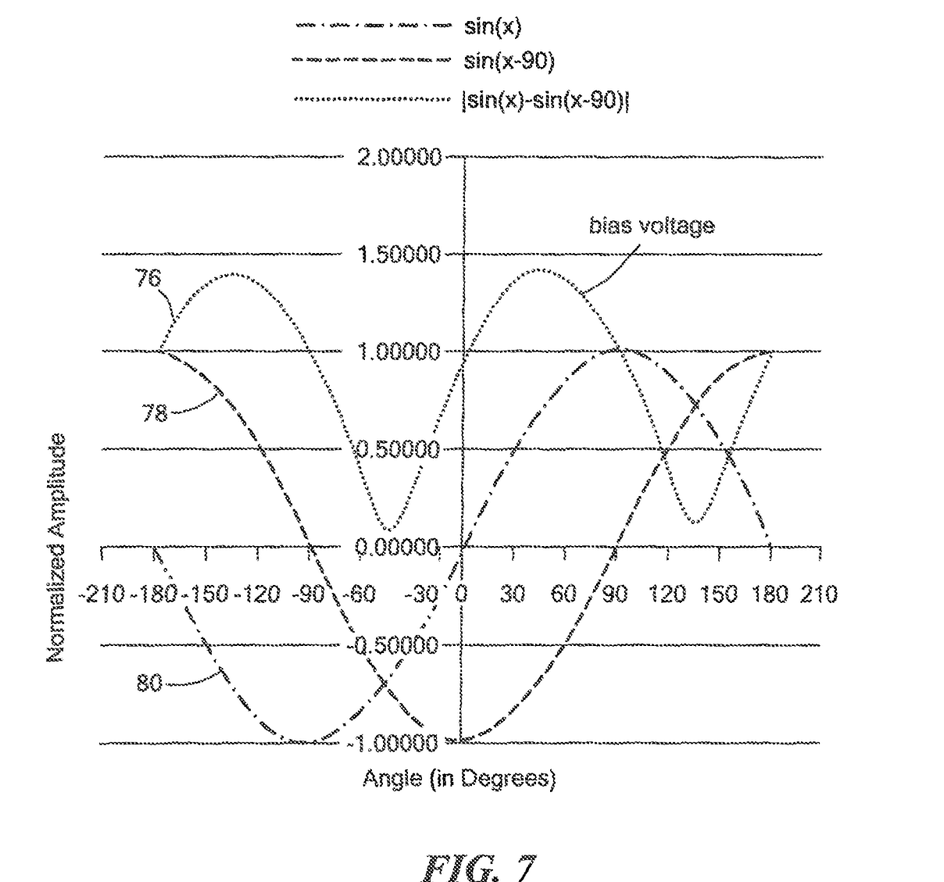
FIG. 7 is a plot of normalized angle vs. amplitude for 90-degree phase difference.
Figure 9:
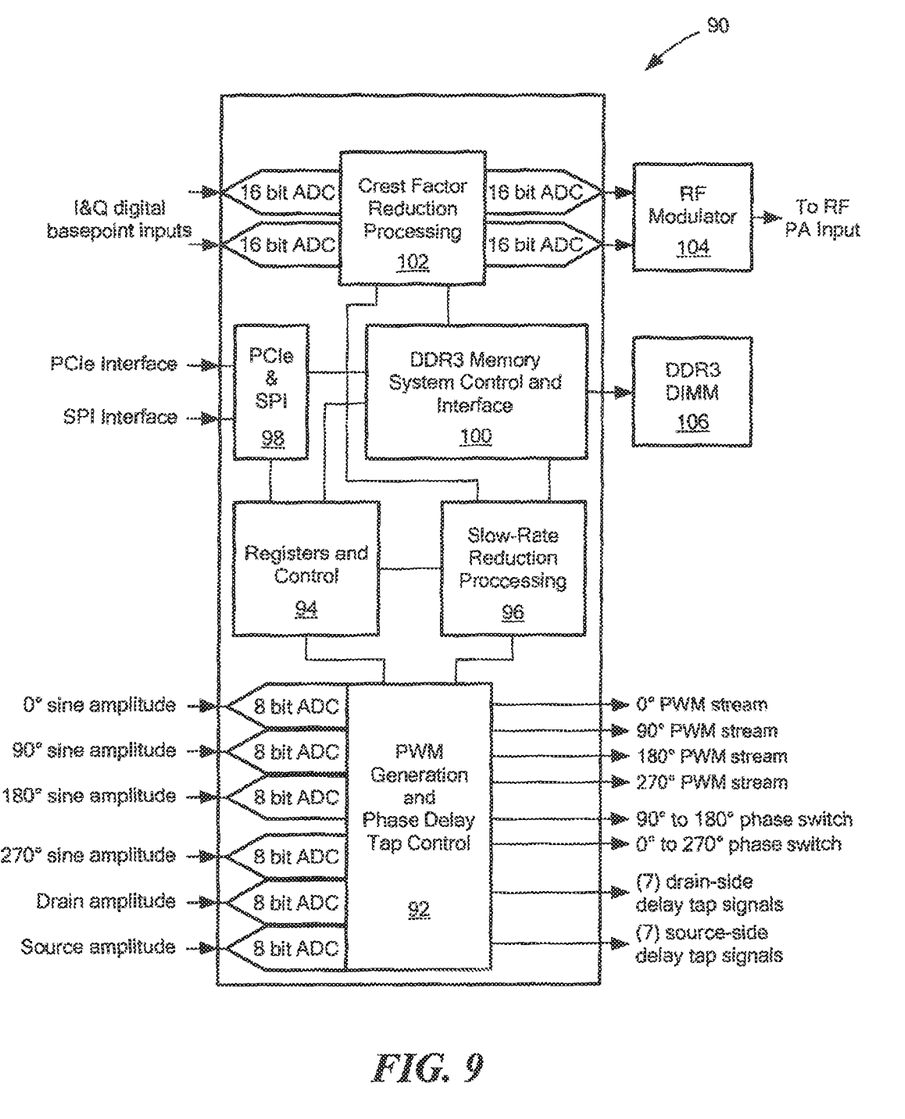
FIG. 9 a block diagram of a field programmable gate array (FPGA) suitable for use in a Dual Rail Out Phased Envelope Tracking (DROP ET) system such as that shown in FIGS. 2 and 3.

Modulator function can be controlled by a processor (such as an FPGA shown in FIG. 9). When a baseband input signal provided to the FPGA has been processed, the FPGA adjusts the tapped delay lines, setting the phase difference ($\theta$) between the sine waves $A_1$ and $A_2$ (FIG. 4). The phase difference sets the instantaneous PA bias voltage. The controller adjusts the PA bias voltage, (calculated from the SRRP adjusted baseband envelope information), by continuously switching taps on the delay line, tracking the required voltage differential along the delay line for up to 180 degrees of phase of the 50 MHz sine wave. At that point the controller reverses (i.e. switches) the out-phased 50 MHz sine wave sources, between drain and source ports. This is necessary to maintain correct voltage polarity with respect to the PA drain and source ports.

The instantaneous bias voltage presented to the RF PA is a function of the amplitudes of the two sine waves, and the phase angle between them. The static phase difference between the drain and source rails is 180°, providing maximum operating bias. The instantaneous voltage differential, $A_3$ may be found from the following equation:

$$A_3 = |A_1 \sin\theta - A_2 \sin\theta - 180°|,$$

in which θ is the phase difference between the drain and source voltages.

When both sine wave amplitudes are equal, the above equation can be simplified somewhat. Since the two sine waves will be constantly cycling amplitude and phase, a history of 180 degrees of phase will be stored in each tapped delay line.

The examples shown in FIGS. 4-7, depict the 180° sine wave power sources at various out-phase angles θ, and the resulting differential voltage $A_3$ which is the bias voltage developed across an RF amplifier such as RF PA 44 in FIG. 3.

The four graphs illustrated in FIGS. 4-7 depict the results for phase differences (theta) and the resulting bias of 180, 30, 60, and 90 degrees, respectively. The traces in the graphs which represent the RF amplifier bias voltage (i.e. curve 54 in FIG. 4; curve 60 in FIG. 5; curve 70 in FIG. 6; and curve 76 in FIG. 7) are annotated with the words "bias voltage."

In an embodiment in which the variable delay element is provided as a delay line, the exact number of delay taps used in any particular application is selected in view of a variety of factors including, but not limited to, the requirement to achieve maximum voltage differential, at any instant within a 180° phase (half-cycle). In an exemplary embodiment in which the AC signal is provided as a sine wave, the maximum amplitude, within twelve percent (12%), is available for about +/-10° of phase. Thus, in this case, taps would preferably be spaced no more than ten degrees (10°) apart.

The speed of phase shifter switching must be faster than the slew rate of the envelope signal. It is important to know the slew rate of the envelope and limit it to the maximum speed of the phase shifter. It should be noted that, in most communication waveforms, the average slew rate is typically much lower than the peak slew rate.

Figure 8:
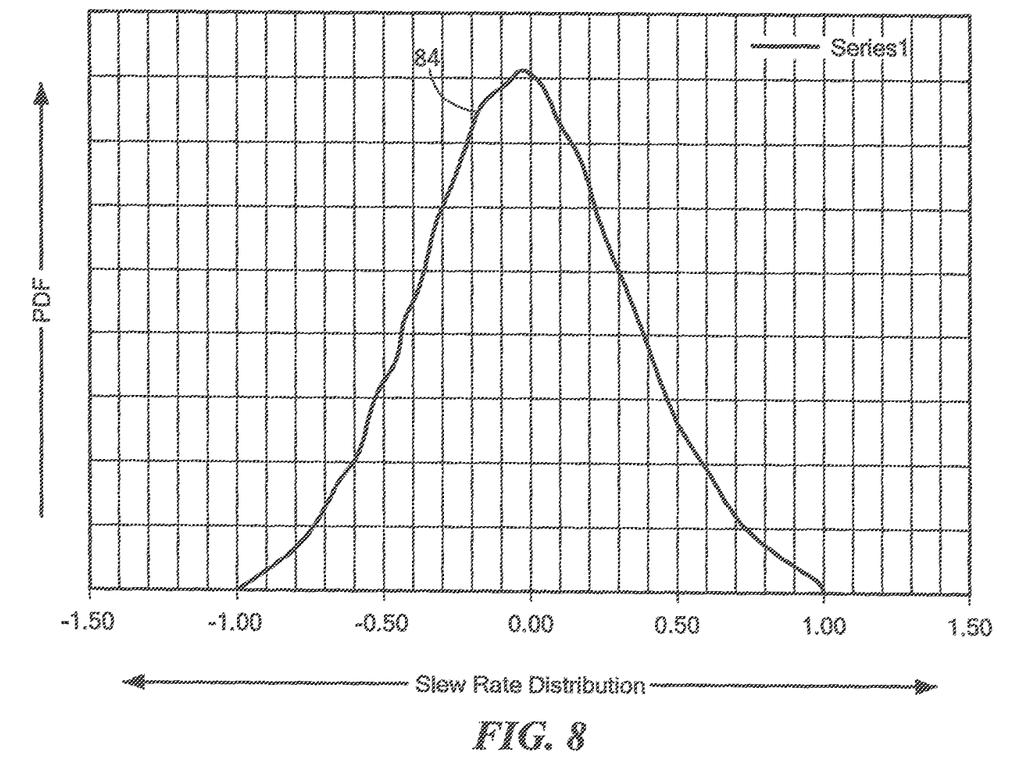
FIG. 8 is a plot of Probability Density Distribution of slew-rate in a WCDMA carrier.

Referring now to FIG. 8, a graph of a probability density distribution of slew rate distribution of WCDMA signal (all units normalized) is shown. Limiting the peak slew rate to a low rate will have limited impact on the fidelity of the signal while much improved system efficiency can be expected. I do not believe that the items above are necessary in this application. Again, they mostly apply to the algorithm patent, for slew-rate limited envelope tracking.

Referring now to FIG. 9, in one embodiment, modulator PWM streams can be generated in an FPGA 90 such as that shown in FIG. 9. Out-phase switch functions are performed by a modulator as are the switch functions for the tapped delay lines.

With respect to RF modulation, baseband digital I-Q data is converted into an analog I-Q signal and applied to a modulator to produce the RF input signal to an RF amplifier. The FPGA 90 includes compensation of the modulator balance, both amplitude and phase offset.

A DROP controller determines the drain and source phase modulator settings in real time. The controller adjusts the phase modulators to anticipate the envelope voltage demand that will occur over a next predetermined period of time. The inputs to the processor are; a) the state of the source and drain signals based upon the associated PWM history, b) the state of the phase modulators based upon the associated PWM history, and c) a forward looking estimate of the slew rate limited input envelope from the SRRP output.

The FPGA samples the drain and source voltage waveforms (e.g. using ADCs). The FPGA also controls the frequency and to some extent the phase of the sinusoidal signals (e.g. the two 50 MHz sinusoidal signals) that drive the drain and source voltages.

Figure 10:
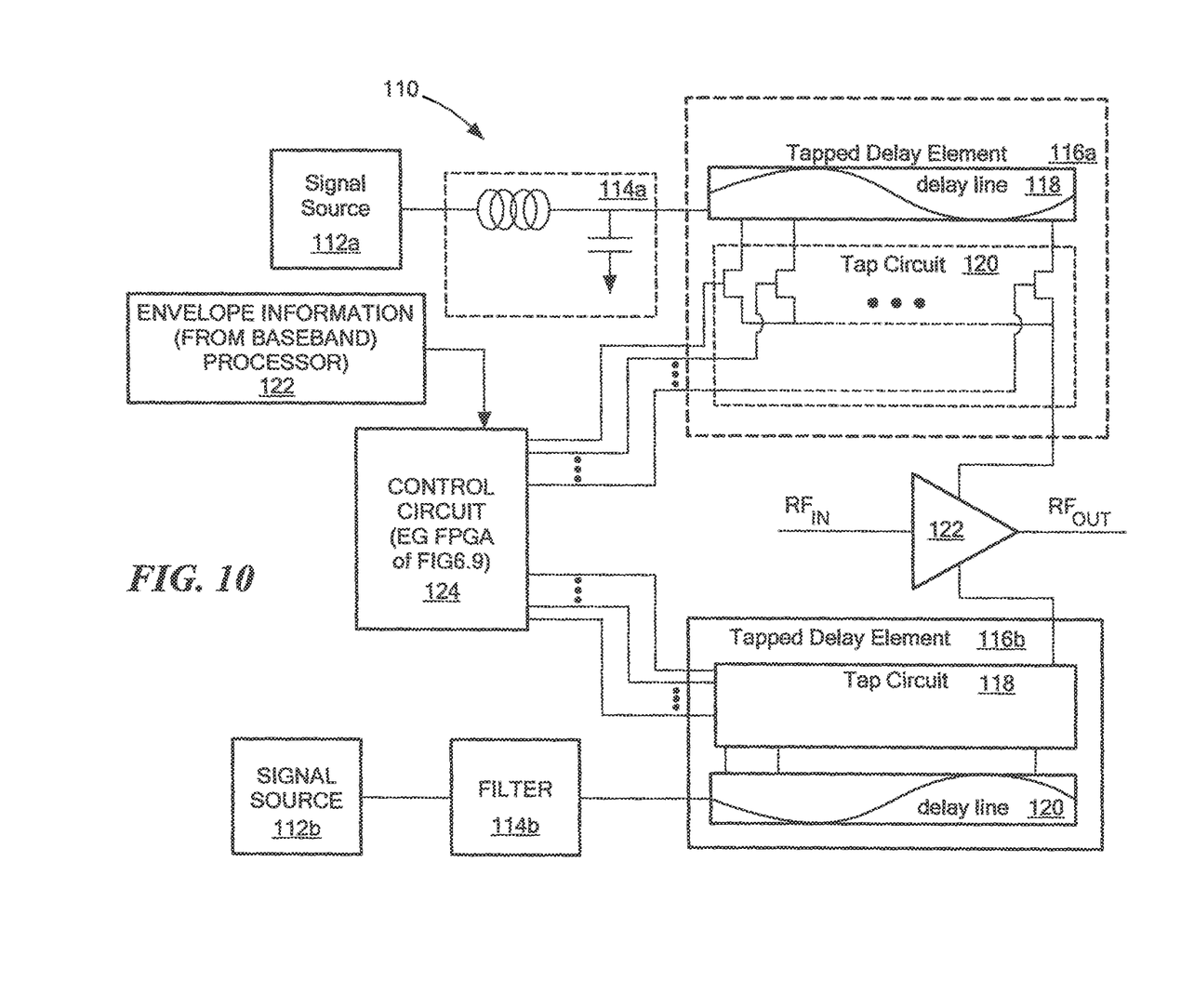
FIG. 10 is a block diagram of a Dual Rail Out Phased Envelope Tracking (DROP ET) modulator.

Referring now to FIG. 10, an exemplary dual rail out-phased envelope tracking (DROP ET) modulator includes a pair of low frequency signal sources 112a, 112b. In one exemplary embodiment, the signal sources are provided as 50 MHz sine wave sources. Signal sources 112a, 112b provide signals through filters 114a, 114b. Filters 114a, 114b are provided having low pass filter characteristics and couple an appropriately filtered signal to inputs of delay line elements 116a, 116b.

A differential voltage between the two sources 112a, 112b is controlled by the phase relationship between the two sources. A phase adjustment process in a control circuit 124 generates a differential voltage waveform that reflects the envelope of the RF signal (e.g. a 10 GHz RF signal). This differential voltage between the two sources is applied to an RF amplifier 122, which may, for example, be provided as a power amplifier (PA). The PA 122 amplifies modulated RF signals provided thereto while the differential voltage maintains the voltage across the PA 122 to a necessary-minimum to keep the efficiency at maximum. The drain side modulator of the PA sources the bias current and the source side modulator sinks the bias current to close the current loop of the PA.

Since the generation of drain bias is carried out at a frequency which is lower than an envelope bandwidth, an efficiency will be achieved which is higher than what can be achieved in a conventional ET.

In the DROP ET architecture of FIG. 10, modulation frequency is not limited by the speed of transistors (e.g. modulation frequency is not limited by the switching speed of CMOS transistors) but by the phase shifter speed, which can support a much higher frequency than a CMOS amplifier. Since efficiency loss in the modulator is minimum in DROP ET compared to the conventional envelope tracking, this approach leads to advances in the composite efficiency of the RF amplification of high frequency modulation.

As shown in FIG. 10, fixed-frequency sine waves can be efficiently generated at a desired frequency (e.g. 50 MHz) and provide fast slew rates, enabling rapid voltage changes across the PA, by applying a very fast phase shift between the two sine waves by switching the taps on delay lines. The tapped delay elements may comprise tapped delay lines (e.g. a phase shift network). In some embodiments, a lumped-element line can be used although in other embodiments a distributed line may be preferred.

Having described preferred embodiments which serve to illustrate various concepts, circuits and techniques which are the subject of this patent, it will now become apparent to those of ordinary skill in the art that other embodiments incorporating these concepts, circuits and techniques may be used. For example, described herein is a specific exemplary circuit topology and specific circuit implementation for achieving a desired performance. It is recognized, however, that the concepts and techniques described herein may be implemented using other circuit topologies and specific circuit implementations. For example, any of the circuit topologies described in conjunction with FIGS. 3-3D and FIGS. 4-4C (as well as any variants thereof) may be incorporated in circuit designs such as those shown in FIGS. 5-7 (or variants of such circuit designs). Accordingly, it is submitted that that scope of the patent should not be limited to the described embodiments but rather should be limited only by the spirit and scope of the following claims.

What is claimed is:

1. A drain modulator circuit for operation with a radio frequency (RF) amplifier having a pair of bias terminals, the modulator comprising:
 a pair of AC signal sources, each of said pair of AC signal sources having an output at which an AC signal is provided;
 a pair of variable delay elements, each of said variable delay elements configured to receive an AC signal from a respective one of said pair of AC signal sources; and
 a control element coupled to provide one or more control signals to said pair of variable delay elements, wherein in response to the one or more control signals from said control element, said variable delay elements introduce a relative shift between the AC signals provided by said pair of AC signal sources such that a differential voltage is provided across the bias terminals of the RF amplifier.

2. The drain modulator circuit of claim 1 wherein said variable delay elements are provided as one of a tapped delay element; or a phase shifter.

3. The drain modulator circuit of claim 1 wherein each of said pair of AC voltage sources are configured to provide a voltage to the amplifier based upon a selected phase difference.

4. The drain modulator circuit of claim 1 wherein said pair of AC signal sources are provided as AC voltage sources which provide signals having a frequency which is lower that an envelope bandwidth.

5. The drain modulator circuit of claim 1 wherein said AC signal sources provide AC signals which are out of phase by an amount which results in a desired voltage across the bias terminals of the RF amplifier.

6. The drain modulator circuit of claim 1 wherein at least one of said pair of AC sources is provided as a pulse width modulator (PWM) source.

7. The drain modulator circuit of claim 1 wherein said control element is adapted to receive an envelope signal and wherein said control element process signal characteristics of the envelope signal to determine characteristics of the one or more control signals provided to said pair of variable delay elements.

8. The drain modulator circuit of claim 1 wherein said pair of tapped delay elements are provided as a pair of phase memory elements, each of the phase memory elements having a first input coupled to an output of a respective one of the AC voltage sources and a first output configured to couple to a respective one of a pair of inputs of the power amplifier and wherein said phase shifters operated to select an instantaneous differential voltage.

9. The drain modulator circuit of claim 1 wherein each of said pair of AC signal sources comprise:
 a pair of phase locked, pulse width modulated (PWM), switch-mode amplifiers which provide a pair of out-phased, voltage rails and wherein the RF amplifier is configured to float between the two voltage rails and wherein the bias voltage value is determined, at least in part, by load demand.

10. The drain modulator circuit of claim 1 wherein each of said pair of AC signal sources are operated to generate differential voltages by out-phasing the respective ones of the pair of the AC signals.

11. The drain modulator circuit of claim 1 wherein each of said pair of AC signal sources generates a fixed-frequency AC signal.

12. The drain modulator circuit of claim 1 wherein said phase shifters are configured to apply a phase shift between the two AC signals to thereby enable rapid voltage changes across the RF amplifier to provide the RF amplifier having desired slew rates.

13. The drain modulator circuit of claim 1 wherein said control element is provided as a field programmable gate array (FPGA) and wherein when the baseband input to the FPGA has been processed, the FPGA adjusts said variable delay elements thereby setting a phase difference between AC signals provided by said pair of AC signal sources.

14. The drain modulator circuit of claim 13 wherein the phase difference sets an instantaneous amplifier bias voltage and wherein said control element adjusts the RF amplifier bias voltage by continuously adjusting phase delay.

15. The drain modulator circuit of claim 14 wherein said variable delay element has a phase memory element having a maximum phase range and wherein in response to a predetermined phase difference and when a maximum phase range of the phase memory element has been reached, said control element reverses said out-phased AC signal sources between drain and source pods to maintain correct voltage polarity with respect to drain and source ports of the RF amplifier.

16. The drain modulator circuit of claim 15 wherein the instantaneous bias voltage presented to the RF amplifier is a function of the amplitudes of the two AC signals, and the phase angle between them.

17. The drain modulator circuit of claim 16 wherein a static phase difference between the drain and source rails is 180° to provide maximum operating bias.

18. The drain modulator circuit of claim 17 wherein at least one of said pair of AC signal sources is provided as: an analog fixed frequency AC signal source; a digital fixed frequency AC signal source; an analog variable frequency AC signal source; or a digital variable frequency AC signal source.

19. The drain modulator circuit of claim 18 wherein the two AC signals are provided as two sine waves with constantly cycling amplitudes and wherein said pair of variable delay elements correspond to a pair of tapped delay lines and wherein each of said tapped delay lines have a history of 180 degrees of phase stored therein.

* * * * *